(12) United States Patent  (10) Patent No.: US 8,957,390 B2
Adamec  (45) Date of Patent: Feb. 17, 2015

(54) ELECTRON GUN ARRANGEMENT (71) Applicant: ICT Integrated Circuit Testing Gesellschaft für Halbleiterprüftechnik GmbH, Heimstetten (DE)

(72) Inventor: Pavel Adamec, Haar (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 14/179,283

(22) Filed: Feb. 12, 2014

(65) Prior Publication Data
US 2014/0264019 A1   Sep. 18, 2014

(30) Foreign Application Priority Data
Mar. 15, 2013  (EP) ..................................... 13159528

(51) Int. Cl.
*H01J 37/073* (2006.01)
*H01J 37/02* (2006.01)
*H01J 37/063* (2006.01)
*H01J 37/24* (2006.01)

(52) U.S. Cl.
CPC ............. *H01J 37/026* (2013.01); *H01J 37/073* (2013.01); *H01J 37/063* (2013.01); *H01J 37/243* (2013.01)
USPC .......................... 250/396 R; 250/310; 315/15

(58) Field of Classification Search
USPC .................................................... 250/396 R
See application file for complete search history.

(56) References Cited

U.S. PATENT DOCUMENTS

| 2011/0084219 A1* | 4/2011 | Adamec et al. ............. 250/492.1 |
| 2011/0221360 A1* | 9/2011 | Adamec ........................ 315/307 |
| 2011/0240855 A1* | 10/2011 | Ohshima et al. .............. 250/310 |

FOREIGN PATENT DOCUMENTS

| EP | 1207545 | 5/2002 |
| EP | 1455380 | 9/2004 |
| EP | 2385542 | 11/2011 |
| EP | 2492949 | 8/2012 |

OTHER PUBLICATIONS

Extended European Search Report dated Jul. 17, 2013 for Application No. 13159528.2.

* cited by examiner

*Primary Examiner* — Michael Logie
*Assistant Examiner* — Hsien Tsai
(74) *Attorney, Agent, or Firm* — Patterson & Sheridan, LLP (57) ABSTRACT A gun arrangement configured for generating a primary electron beam for a wafer imaging system is described. The arrangement includes a controller configured for switching between a normal operation and a cleaning operation, a field emitter having an emitter tip adapted for providing electrons and emitting an electron beam along an optical axis, an extractor electrode adapted for extracting the electron beam from the emitter tip electrode, a suppressor electrode, and at least one auxiliary emitter electrode arranged radially outside the suppressor electrode, and provided as a thermal electron emitter for thermally emitting electrons towards the optical axis.

20 Claims, 4 Drawing Sheets

ELECTRON GUN ARRANGEMENT

FIELD OF THE INVENTION

The invention relates to a charged particle beam device for inspection system applications, testing system applications, lithography system applications, electron microscopes and the like. It also relates to methods of operation thereof. Further, the present invention relates to a charged particle beam device with a cleaning system. Specifically, it relates to a gun arrangement, a charged particle beam device, a method of cleaning and operating a charged particle beam device, and method of cleaning a surface of an extractor electrode of an electron gun arrangement.

BACKGROUND OF THE INVENTION

Charged particle beam apparatuses are used in a plurality of industrial fields. Inspection of semiconductor devices during manufacturing, exposure systems for lithography, detecting devices and testing systems are only some of these fields.

In general, there is a high demand for structuring and inspecting specimens within the micrometer or nanometer scale. On such a small scale, process control, inspection or structuring is often done with charged particle beams, e.g. electron beams, which are generated and focused in charged particle beam devices such as electron microscopes or electron beam pattern generators. Charged particle beams offer superior spatial resolution compared to, e.g. photon beams due to their short wavelengths.

Generally, charged particle beam devices are operated under vacuum conditions to avoid, e.g. ionization of surrounding gases. In spite of that, electrons impinging on component surfaces of the device, like extractors, anodes, apertures or the chamber wall result in an emission of contaminants. Thus, a shower of residual gas is generated. The residual gas contains molecules which can be hit by electrons. Thereby, ions, ionized molecules and other particles can be created. In the case of ions and ionized molecules having a charge which is opposite to the charge of the charged particles emitted by an emitter, the ions and ionized molecules in the residual gas are accelerated towards the emitter. As a result, the emitter can be mechanically deformed from the impingement of the ions and ionized molecules or these particles can be deposited on the emitter. Thus, emitter noise is introduced.

The above described contaminations are even more critical for cold field emitters or thermally assisted cold field emitters (CFE), because such emitters have an even higher need to have a high vacuum and a clean environment. Even though such emitters are known for a long time, implementation thereof in industrial applications, wherein a high availability of systems and high stability due to desired automation is demanded, have been experienced to be difficult due to these requirements. Thus, it is difficult to provide a high brightness electron source for electron microscopy, such as a CFE or thermally assisted CFE, and more specifically for electron beam based wafer inspection, with sufficient stability of operation.

SUMMARY OF THE INVENTION

The present invention intends to provide an improved electron gun arrangement and/or an improved charged particle beam device.

According to one embodiment, a gun arrangement configured for generating a primary electron beam for a wafer imaging system is provided. The arrangement includes a controller configured for switching between normal operation an cleaning operation, a field emitter having an emitter tip adapted for providing electrons, wherein the field emitter is selected from the group consisting of: a cold field emitter and a thermally assisted cold field emitter, and wherein the emitter is electrically connected to the controller, an extractor electrode adapted for extracting the electron beam from the emitter tip electrode, a suppressor electrode arranged radially outside the emitter particularly wherein the emitter tip is protruding through the suppressor electrode, and wherein at least one of the suppressor electrode and the extractor electrode is electrically connected to the controller such that the suppressor electrode is a first potential relative to the extractor electrode during normal operation and at a second potential relative to the extractor electrode during cleaning operation, and at least one auxiliary emitter electrode arranged radially outside the suppressor electrode, and provided as a thermal electron emitter for thermally emitting electrons towards the optical axis.

According to another embodiment, a method of cleaning at least one surface of an extractor electrode of an electron gun arrangement is provided. The method includes providing a potential to a suppressor electrode being a negative potential relative to the extractor electrode, as an optional typical example to a negative voltage with an absolute value of 0.5 kV or greater, thermally emitting electrons from an auxiliary emitter electrode, and pre-treating the at least one surface of the extractor electrode surface using the thermally emitted electrons, wherein the potential of the suppressor electrode controls an area of pre-treatment with thermally emitted electrons.

According to a further embodiment, a wafer imaging system or a charged particle column for imaging a specimen is provided. The system includes a gun arrangement. The arrangement includes a controller configured for switching between normal operation an cleaning operation, a field emitter having an emitter tip adapted for providing electrons, wherein the field emitter is selected from the group consisting of: a cold field emitter and a thermally assisted cold field emitter, and wherein the emitter is electrically connected to the controller, an extractor electrode adapted for extracting the electron beam from the emitter tip electrode, a suppressor electrode arranged radially outside the emitter, particularly wherein the emitter tip is protruding through the suppressor electrode, and wherein at least one of the suppressor electrode and the extractor electrode is electrically connected to the controller such that the suppressor electrode is a first potential relative to the extractor electrode during normal operation and at a second potential relative to the extractor electrode during cleaning operation, and at least one auxiliary emitter electrode arranged radially outside the suppressor electrode, and provided as a thermal electron emitter for thermally emitting electrons towards the optical axis. The system further includes an objective lens configured for focusing the electron beam on the wafer, at least one condenser lens provided between the emitter tip and the objective lens, and a scanning deflector arrangement for scanning the electron beam over the specimen to generate the image of the wafer.

The invention is also directed to an apparatus for carrying out the disclosed methods, including apparatus parts for performing each of the described method steps. These method steps may be performed by way of hardware components, a computer programmed by appropriate software, by any combination of the two or in any other manner. Furthermore, the invention is also directed to methods by which the described apparatus operates or is manufactured. It includes method steps for carrying out every function of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DESCRIPTION OF THE PREFERRED EMBODIMENTS

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

Without limiting the scope of protection of the present application, in the following the charged particle beam device or components thereof will exemplarily be referred to as a charged particle beam device including the detection of secondary electrons. Embodiments of the present invention can still be applied for apparatuses and components detecting copuscles, such as secondary and/or backscattered charged particles in the form of electrons or ions, photons, X-rays or other signals in order to obtain a specimen image. Generally, when referring to corpuscles they are to be understood as light signals in which the corpuscles are photons as well as particles, in which the corpuscles are ions, atoms, electrons or other particles.

A "specimen" or "wafer" as referred to herein, includes, but is not limited to, semiconductor wafers, semiconductor workpieces, and other workpieces such as memory disks and the like. Embodiments of the invention may be applied to any workpiece on which material is deposited or which is structured. A specimen includes a surface to be structured or on which layers are deposited, an edge, and typically a bevel. According to some embodiments, which can be combined with other embodiments described herein, the apparatus and methods are configured for or are applied for electron beam inspection, for critical dimensioning applications and defect review applications Without any further clarification, potentials and voltages referred to in the application are understood as relative potentials in comparison to the potential of another element in the column. For example, accelerating the beam by connecting an emitter to "ground" and applying a positive potential to an extractor is equivalent to applying negative potential of the same absolute value to the emitter and connecting the emitter to ground. Therefore, while for convenience some discussion is provided in terms of specific voltages, it should be understood that reference is made to relative potentials. Accordingly, the term "biasing" a first element in the column refers to providing a defined potential as compared to other elements in the column, which can include connecting the first element to a fixed potential, e.g., ground and biasing the other element.

Generally, when referring to focusing a charged particle beam, it is understood that the beam of charged particles is reduced in divergence. This means, the charged particles of a beam are focused or at least collimated towards a subsequent beam optical element to decrease losses of charged particles due to divergence or due to blocking of charged particles. Correspondingly, defocusing is understood as increasing the divergence.

According to embodiments described herein, an improved gun arrangement with a cleaning emitter is provided. Particularly for high brightness emitters, such as CFEs and thermally assisted CFEs, cleaning of gun chamber components and other components in a charged particle beam column is of importance. Thereby, it should be considered that on industrial standards high stability for automation purposes and/or long system uptimes need to be provided.

The brightness of the source is an important parameter for the achievement of high resolution and high throughput in the electron beam based inspection system. The typical source is based on the sham conductive (metallic) tip where the electrons are extracted by high electric field (cold field emission, CFE), possibly assisted by increased temperature (thermal assisted field emission). The electrons are then emitted from very small surface area. This makes the emission very sensitive even to single atom adsorption on the emitting surface. The atoms that might adsorb on the emitting surface originate mainly from the surrounding surfaces, especially from the extracting electrode where desorption of atoms can be stimulated by electron beam coming from the emitter tip.

According to typical embodiments, the emitter tip may include any material selected from the group consisting of: tungsten, molybdenum, tantalum, carbide such as HfC, ZrC, and any combinations thereof. In order to provide electron admission from the emitter tip using thermally assisted field emission, the emitter tip may be heated. According to a typical embodiment, the emitter tip may be heated to a temperature above ambient temperature.

According to embodiments described herein, an arrangement for an initial cleaning of the surface of the extracting electrode, e.g. of an extractor or an anode, Is provided. Thereby, the electron stimulated desorption during the operation of the CFE is reduced.

Figure 1:
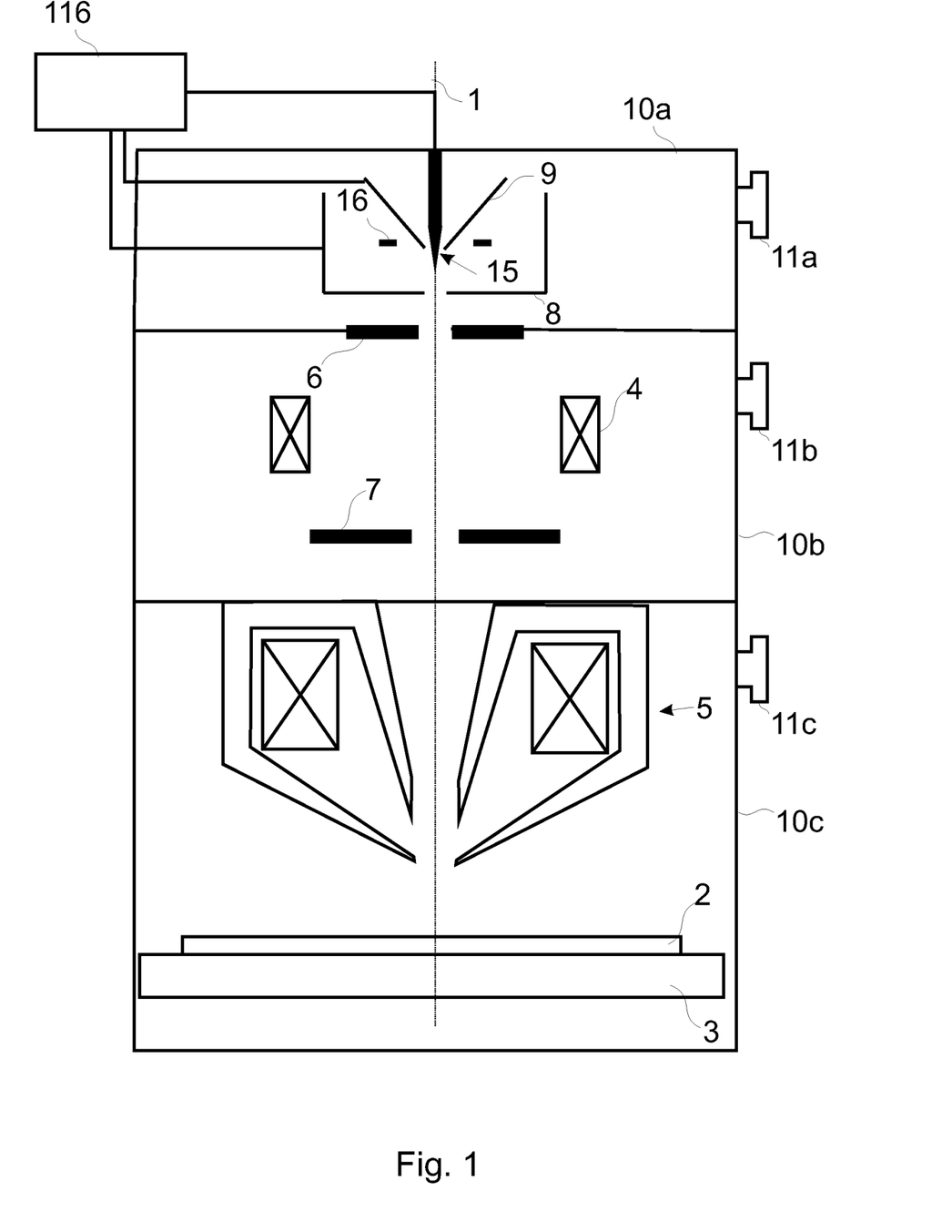
FIG. 1 shows a schematic side view of a charged particle beam device or wafer imaging system with an electron beam device according to embodiments of the present invention.

FIG. 1 illustrates embodiments according to the present invention. Generally, electron beam devices are operated under vacuum conditions. Therefore, a vacuum pump is connected to a port of each chamber of the device. Within FIG. 1 a gun chamber 10a, an intermediate vacuum chamber 10b and a specimen chamber 10c are provided. Typically, each of the chambers has one or more vacuum ports 11a, 11b and 11c, respectively, for connecting of vacuum pumps or vacuum pump systems. Thereby, the requirement for the degree of vacuum is increasing from the specimen chamber to the gun chamber, i.e. the gun chamber has typically the lowest pressure in the column.

Gas molecules, which could be ionized by the electron beam, are pumped out of the device. Without limiting the scope of the invention to systems with several chambers, commonly, the device is subdivided, into different chambers 10a to 10c. For example, the vacuum required for operation of an electron gun has a lower pressure than the vacuum required close to a specimen. Thus, it is common to provide at least a gun chamber 10a, a chamber 10b for other beam guiding means in the column and a specimen chamber 10c. The vacuum pumps are operated most of the time to pump molecules, which get into one of the chambers during assembly of the electron beam device, during maintenance, through leaks or through introduction of a new specimen, out of the chamber. Before the intended use of the device starts, the chambers have to be pumped down to a determined pressure level.

During intended use, e.g. inspection, imaging, testing or patterning of specimen 2, electron beam emitter 15 emits an electron beam along optical axis 1. Thereby, the term "intended use" is to be understood as conducting measurements or patterning for, e.g inspection, imaging, testing, patterning for lithography or the like, whatever purpose the electron beam device has. The present disclosure refers, contrary to intended us, to cleaning steps, alignment steps, calibration steps or the like as maintenance operations.

Cold field emitters have particularly high demands for cleanliness of the gun chamber 10a. Accordingly, pressures of $1\times10^{-11}$ mbar or below are provided. Typically pumps selected from the group consisting of: a getter pump, a sublimation pump, e.g. a titanium sublimation pump, and a NEG (non evaporable getter) are connected to vacuum flange 11a.

For emission of e.g. electrons, the emitter tip is biased to a negative potential as compared to the extractor such that a voltage of 3 keV to 20 keV is provided between the emitter 15 and the extractor 8. The suppressor is thereby used during normal operation to adjust the divergence of the emitted beam, e.g., such that a beam shaping at the anode 6 or at another final aperture can optionally result in the desired beam current.

During cleaning operation the auxiliary emitter electrode 16 is heated such that electrons are thermally emitted. These thermally emitted electrons impinge on surface an desorb molecules and atoms which are provided at the surfaces even at high vacuum conditions. During a common cleaning with an electron flood gun or other electron emission arrangements, the electrons for cleaning are widely spread in the gun chamber, e.g. a wide area of the extractor 8 and to other components in the gun chamber. Thereby, many molecules are desorbed in light of the size of the area which is cleaned by the thermally emitted electrons. However, in light of the high demands for pressure and cleanliness in the gun chamber for cold field emitters, this is beneficially avoided. Accordingly, for embodiments described herein, the suppressor 9 is utilized for the cleaning process. As the auxiliary emitter electrode 16 is provided at a radial position with respect to the optical axis 1, which is outside of the radial position with respect to the optical axis of the suppressor, areas inside the suppressor electrode are not treated with electrons.

Further, the suppressor is typically biased to a negative potential during cleaning. Accordingly, areas of the gun chamber behind the auxiliary emitter electrode 16 are not treated by electrons. In other words, the cleaning area is focused and/or concentrated to areas close to the opening in the extractor 8. Accordingly, only a small surface area around the optical axis is cleaned. This area around the optical axis is beneficially cleaned as the electron beam during normal operation, which is emitted by the emitter 15 can also impinge on these surface and result in stimulated desorption. As the stimulated desorption during normal operation is not beneficial, these areas have to be cleaned. However, according to embodiments described herein, which can be combined with other embodiments described herein, the area of the cleaned surfaces is delimited by the biasing of the suppressor. Accordingly, the cleaning process is selective. Desorption at surfaces, which are not critical, is avoided. Thereby, the cleaning process does not result in an unnecessary loss of low pressure and in an unnecessary amount of desorbed particles in the gun chamber 10a. Without such measures, the duration of the pumping process until normal operation could be conducted would be significantly larger.

According to embodiments described herein, a controller is provided, which is configured to conduct a cleaning process. The controller 116 is connected to the suppressor and the extractor such that electrons emitted during cleaning from the auxiliary emitter electrode 16 are guided towards the opening of the extractor 8.

According to typical embodiments, which can be combined with other embodiments described herein, distance of the emitter tip to the extractor electrode is 3 mm or below and/or 0.3 mm or above, e.g. 0.1 mm to 2 mm, or 0.2 mm to 1 mm, or 0.3 to 2 mm.

According to yet further embodiments, which can be combined with other embodiments described herein, the controller 116 is further connected to the emitter 15. Thereby, during cleaning the emitter can also be biased to a negative potential. Accordingly, the emitter can protect itself from impingement of thermally emitted electrons during cleaning, which could destroy or deteriorate the emitter's characteristics.

During normal operation, the emitted electron beam is further guided with the following components. The electrons are extracted by the extraction electrode 8 and accelerated along the optical axis 1 through anode 6 or a beam aperture provided instead of the anode 6 towards the specimen or wafer. A first condenser 4 might be used to focus the electron beam. Thus, electrons do not move in arbitrary directions as compared to the optical axis. Instead, the electrons move along the optical axis and are focused. Extractor 8 and anode 6 have e.g. a potential of 5 kV with respect to the emitter. Thereby, electrons of the electron beam emitter are accelerated towards specimen 2. Condenser lens 4 and aperture 7 are used to further shape the electron beam. Additionally, depending on the strength of the focusing field of condenser 4, more or less of the electron beam is suppressed by aperture 7. Thus, the beam current applied to the specimen can be adjusted with the strength of the focusing field of the condenser.

Objective lens 5 focuses the electron beam on specimen 2. Thereby, an electron beam spot of a few nanometers can be achieved. This beam spot can either be used to image the specimen or write a pattern thereon. Additional components (not shown) for deflecting the beam, adjusting the beam position relative to optical axis 1 or scanning the beam over an area of the specimen can be used. Further, the specimen, which is located on specimen stage 3, can be moved two-dimensionally in relation to the optical axis by moving the specimen stage.

According to typical embodiments, which can be combined with other embodiments described herein, a magnetic-electrostatic objective lens with a magnetic lens component and an electrostatic, lens component is provided. Thereby, the electrostatic lens component can be provided as a retarding lens in order to decelerate the primary electron beam from the high energy in the column to the lower landing energy, e.g. of 1 keV or below. The combination of the emitter according to embodiments described herein and the retarding objective lens is particularly useful for having a high current density on the specimen or wafer. Accordingly, this combination is particularly beneficial for high throughput.

However, as described above, electrons impinging on any components like extractor 8, anode 6 or the like cause the release of molecules from the surfaces hit by the electrons. Thereby, a shower of residual gas is created. This residual gas can be ionized by the electron beam. Positively charged ions of the ionized residual gas are accelerated towards emitter 15. The ions, accelerated to high energies, can either be deposited on the electron beam emitter or mechanically deform the emitter. Thereby, the electron beam current is influenced by these ions and current noise and/or damage of the emitter occurs.

Thus, before the intended use described above, a pretreatment of the electron beam device is required. Thereby, cleaning emitter 16 is used to produce electrons. These electrons also impinge on selected surfaces of extractor 8, anode 6 and other components. The residual gas created can be pumped out of the device with vacuum pumps. In contrast to the intended use, electron beam emitter 15 is not as strongly negatively biased during the cleaning operation, e.g. a few volts. Thus, ions from the ionized residual gas, which are present in a smaller number anyhow, are not strongly accelerated directly towards electron beam emitter 15.

Compared to other solution, the cleaning emitter 16 does not require much extra space within the device. Further, the area, which is cleaned can be selected and adjusted by utilizing the suppressor 16 for the cleaning process. Additionally, electrons, which are emitted by the cleaning emitter to clean the surfaces, travel approximately along optical axis 1. Thereby, especially the surfaces, which might be hit by the electron beam during the intended use, are cleaned. Thus, the cleaning step concentrates on the surfaces relevant for the intended use.

According to embodiments described herein, which can be combined with other embodiments described herein, electron emitter arrangement is provided. The arrangement includes a field emitter tip, optionally with a heater for heating the tip for thermally assisted field emission, an extractor electrode, suppressor electrode and additional thermal electron emitter arranged radially outside the suppressor electrode, e.g. between suppressor electrode and extractor, so that illumination of a defined portion of the surface of the extractor with thermally emitted electrons is possible. The thermal electron emitter can have a ring shape arranged concentrically with respect to suppressor. The extractor electrode can have a cup shape in order to avoid scattered electrons to spread outside the suppressor-extractor area.

Figure 2:
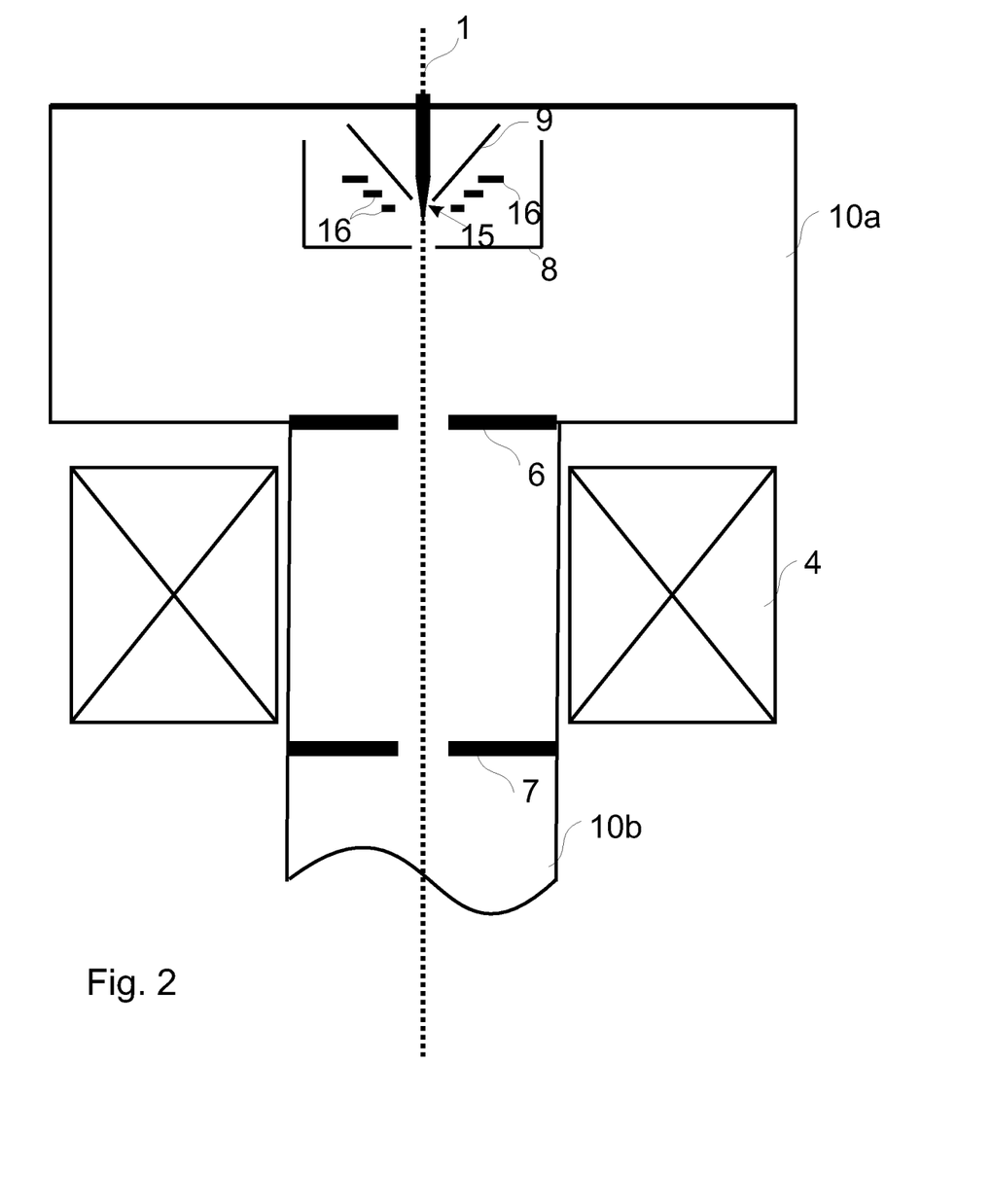
FIG. 2 shows a schematic side view of an embodiment of an electron beam device according to the invention.

FIG. 2 shows two chambers of the electron beam device. This is: the gun chamber 10*a*, and a further chamber 10*b*. As shown in FIG. 2, more than one auxiliary emitter electrode 16 can be used to emit cleaning electrons. In the case where an off-axis electron flood gun 42 would be used, only a view of the components that might be hit by electrons during the intended use would be cleaned. Further, cleaning of components outside of gun chamber 10*a*, which are provided along the optical axis 1 is more difficult. The surfaces of extractor 8, anode 6, aperture 7 and the like are particularly critical concerning the creation of residual gas during the intended use. Yet, as described above, a selection and/or limitation of the surface area is desired in order to avoid excessive stimulated desorption. Thus, positioning the cleaning emitter concentric to the suppressor 9 and close to the optical axis makes a cleaning of all relevant surfaces possible.

As already describe above, before the intended use, a cleaning step making use of cleaning emitter 16 is conducted. This is not to be understood as conducting the cleaning step before every measurement or patterning operation, but as conducting the cleaning step e.g. once after assembly, after maintenance or after any operation that could introduce contamination to the interior of the device before the intended use starts. Additionally, the cleaning step could be used on a regular basis, e.g. every 100 to 1000 measurements, before the regular use starts. Thus, the cleaning step is only required before the intended use in the case where the surfaces hit by the electron beam during intended use are contaminated with molecules, atoms, ions or the like. However, according to a different usage of the cleaning emitter, the cleaning process can be in operation all the time. Alternatively, the cleaning process can only be disabled during the intended use of the charged particle device. Thus, an improved cleanness can be achieved. In case the cleaning is disabled during the intended use, acceleration of ions or ionized molecules from the residual gas towards e.g. a field emitter tip can be avoided.

As already described above, within the cleaning step, cleaning emitter 16 emits electrons which impinge on the surfaces of the electron beam device, namely, the extractor 8, anode 6, parts of the housing or the like. Thereby, a shower of residual gas is released from the respective surfaces. This residual gas is then pumped out of the gun chamber 10*a*, chamber 10*b* or other chambers of the device.

Thereby, a further aspect has to be considered. As shown in FIG. 2, the electron beam emitter for intended use is a field emitter comprising a wire and field emitter tip. Generally, the field, emitter tip is welded to a wire. For field emission, a high potential is applied to the field emitter. Due to the small radius of curvature of the emitter tip, high electrical fields are obtained. Thereby, electrons can escape from the emitter tip surface. However, these high electrical fields would also act on ionized atoms or molecules, in the case of an insufficient cleaning of the chamber. Due to the small radius of curvature, the ionized atoms and molecules would be focused on the field emitter tip. Thus, the presented cleaning embodiment and the method of operating thereof are especially valuable for field emitters. During the operation of cleaning emitter 16, field, emitter does not need to be biased similar to the intended use. However, some negative potential can prevent electrons from the auxiliary emitter electrode 16 to impinge on the emitter 15. Due to the reduced potential, there is no focusing force towards emitter tip 15 acting on the ionized atoms and molecules.

A further aspect to be considered refers to the biasing of the components that are surrounding the emitters. According to one usage of the cleaning unit, the emitter, the extractor 8 and the aperture 6 are biased such that electrons from the auxiliary emitter electrode 16 are accelerated less as compared to the intended use. Thereby, an acceleration of ionized atoms and molecules is also reduced. Thus, damage introduced by the ionized atoms and molecules during the cleaning operation can be reduced. In view of the above, the usage of a thermionic emitter as a cleaning emitter might be advantageous, since a thermionic emitter can be biased to voltages about one magnitude below the voltages required for field emitters.

Figure 3A:
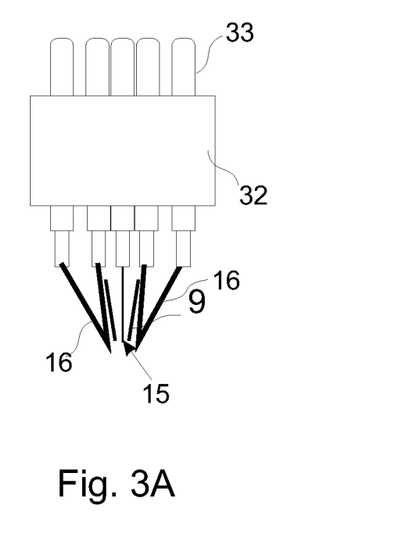
FIG. 3A shows a schematic side view of an embodiment of an emitter cleaning filament module according to the invention.
Figure 3B:
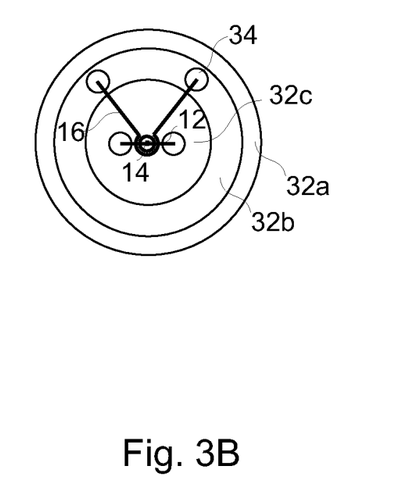
FIG. 3B shows a schematic view of further embodiments of cleaning emitters filament modules.

An embodiment of an electron emitter-cleaning filament module is described with respect to FIGS. 3A and 3B. The emitter module comprises a carrier body 32. The carrier body comprises insulating material to provide an insulation for the feed-through 34 of the high voltage wires. The high voltage for the electron beam emitter 15 and the cleaning emitter 16 is applied to contact pins 33. These contact pins are connected to the wire of the electron beam emitter 15 and to the filament of cleaning emitter 16. As shown in FIGS. 3A and 3B, the electron beam emitter 15 for the intended use is a field emitter with field emitter tip connected to a wire. Cleaning emitter 16 is a thermionic emitter made of tungsten, Lanthanum Hexaboride or the like. Thereby, high currents can be achieved. Therefore, a tungsten filament has a thickness of at least 50 µm. The filament thickness can be between 50 µm and 500 µm. Preferably, it is between 100 µm and 200 µm. Thus, the filament is strong enough to allow heating to high temperatures as compared to other usages of tungsten filaments. The high currents achieved thereby enable a fast cleaning.

As shown in FIG. 3A, the tungsten wire of cleaning emitter 16 can be formed such that two tips adjacent to electron beam emitter 15 are formed. Two cleaning emitters 16 can be provided. The cleaning emitters 16 are located next to electron beam emitter 15. The two cleaning emitters can be biased via separate wires.

A further embodiment is shown in FIG. 3B. Therein, two modifications as compared to the previous embodiments are illustrated. These modifications, namely the construction of carrier body and the arrangement of cleaning emitter 16, can be combined independent of each other with other embodiments described within the application.

In FIG. 3B, carrier body 32 comprises three components 32a, 32b and 32c. However, these components are arranged such that they form one carrier body, which can e.g. during maintenance of an electron beam device be replaced in one piece. Thus, according to the present invention, the carrier body can be made of a single piece unit with feed-throughs 34 for e.g. the emitter wire, can be made of several pieces with feed-throughs or can be made of several pieces with feed-throughs at the intersection of the several pieces.

In FIG. 3B, cleaning emitter 16 is provided in the form of a ring around field emitter tip 14. Thus, cleaning electrons can be emitted over a wide area in the vicinity of the optical axis. Thus, many cleaning electrons can be provided close to the optical axis. The radius of the cleaning emitter ring can be in the range of 100 µm to 2 mm and is preferably between 200 µm and 0.5 mm.

The terms and expressions which have been employed, herein are used as terms of description and not of limitation, and there is no intention, in the use of such terms and expressions, of excluding any equivalents of the features shown and described or portions thereof. Having thus described the invention in detail, it should be apparent that various modifications can be made in the present invention without departing from the spirit and scope of the following claims.

According to embodiments described herein, utilizing of a suppressor for cleaning with a thermionic cleaning emitter can improve the cleaning process. Thereby, it has to be considered that the different components can, according to different embodiments be biased as follows. During intended use, i.e. normal operation, the extractor can be biased to a potential of 3 kV to 20 kV relative to the emitter and the suppressor can be biased to a potential of −5V to −500V relative to the emitter. During cleaning of the gun chamber and/or other chambers and the respective components therein, the extractor can be biased to a potential of +500 V to +2000 V relative to the emitter, and the suppressor can be biased to a potential of 0 V to +10 or even up to +50 V relative to the emitter.

Figure 4:
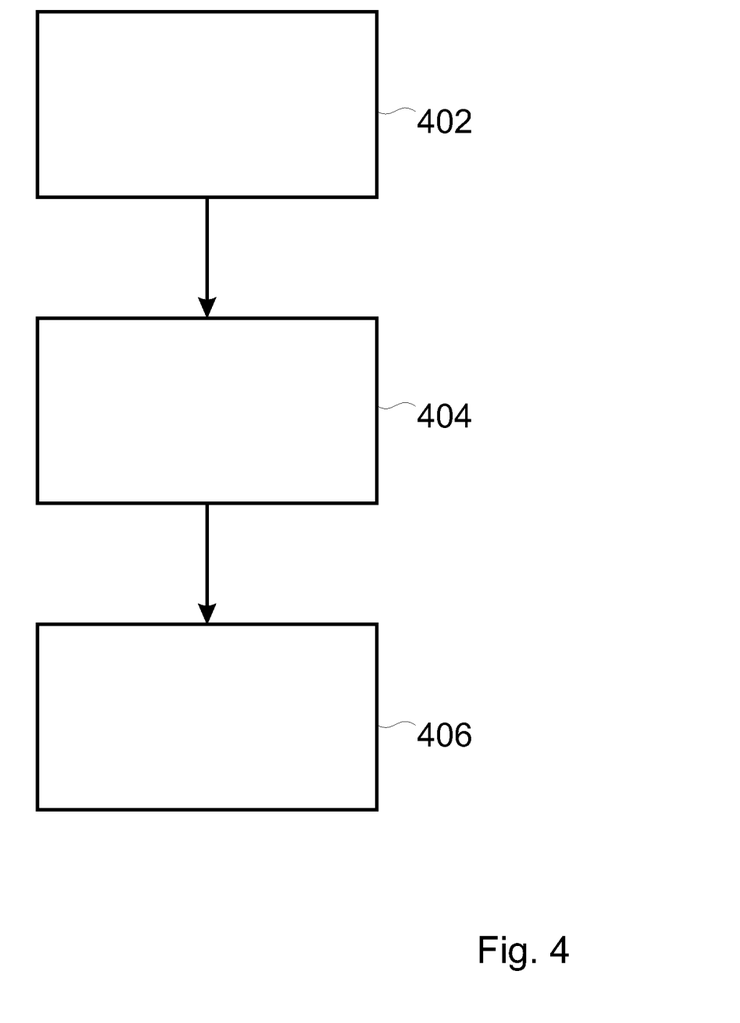
FIG. 4 a flow chart illustrating embodiments of cleaning an emitter.

FIG. 4 illustrates embodiments of cleaning. Typically, at least one surface of an extractor electrode of an electron gun arrangement is cleaned. In step 402 the suppressor electrode is biased to a positive potential relative to the emitter, particularly to 0V to +50V, or even above. In step 404 electrons are thermally emitted from an auxiliary emitter electrode. In step 406 the at least one surface of the extractor electrode surface is treated using the thermally emitted electrons, wherein the biasing of the suppressor electrode controls an area of pretreatment with thermally emitted electrons.

According to yet further implementations thereof the emitter tip can be biased to a negative potential during thermally emitting electrons, i.e. negative relative to the extractor and by a few volts also relative to the suppressor. The biasing of the suppressor forces thermally emitted electrons away from areas outside the surface of the extractor electrode. An extractor electrode can be biased to a positive potential, particularly to 0.5 to 2 kV relative to the emitter. According to yet further embodiments, which can be combined with other embodiments described herein, the method can further include switching from a cleaning mode to a mode of intended use, i.e. normal operation.

In light of the above, a plurality of gun arrangements for generating a primary electron beam have been described. Thereby, the gun arrangements, which can also be described as a source device or an electron beam device can provide for a high brightness, which can be beneficial for wafer imaging applications, e.g. critical dimensioning, defect review, wafer inspection (EBI) or the like. Embodiments also relate to wafer imaging systems configured for imaging a wafer. The gun arrangements and electron beam device can thereby serve as an upgrade kit for a wafer imaging system. The systems can include beyond the electron beam device according embodiments described herein, one or more of the following components: an objective lens configured for focusing the electron beam on the wafer, wherein the objective lens comprises a magnetic lens component and, optionally an electrostatic lens component; at least one condenser lens provided between the emitter tip and the objective lens; a scanning deflector arrangement for scanning the electron beam over the specimen or wafer to generate the image of the wafer; and a beam separator for spatially separating the electrons emitted from the emitter tip and forming the primary electron beam from electron originating from the wafer and forming the signal electron beam.

While the foregoing is directed to embodiments of the invention, other and further embodiments of the invention may be devised without departing from the basic scope thereof, and the scope thereof is determined by the claims that follow.

The invention claimed is:

1. A gun arrangement configured for generating a primary electron beam for a wafer imaging system, comprising:
  a controller configured for switching between normal operation and cleaning operation;
  a field emitter having an emitter tip adapted for providing electrons and emitting an electron beam along an optical axis, wherein the field emitter is selected from the group consisting of:
  a cold field emitter and a thermally assisted cold field emitter, and wherein the emitter is electrically connected to the controller; and
  an extractor electrode adapted for extracting the electron beam from the emitter tip electrode;
  a suppressor electrode arranged, with respect to the optical axis, radially outside the emitter, wherein at least one of the suppressor electrode and the extractor electrode is electrically connected to the controller such that the suppressor electrode is at a first potential relative to the extractor electrode during normal operation and at a second, negative potential relative to the extractor electrode during cleaning operation; and
  at least one auxiliary emitter electrode arranged, with respect to the optical axis, radially outside the suppressor electrode, and provided as a thermal electron emitter for thermally emitting electrons towards the optical axis.

2. The arrangement according to claim 1, wherein the auxiliary emitter electrode has an approximately ring-shaped structure, the ring-shaped structure being arranged approximately concentrically with respect to the suppressor electrode.

3. The arrangement according to claim 1, wherein the extractor electrode has a cup-shaped structure, the cup-shaped structure being arranged approximately concentrically with respect to the suppressor electrode.

4. The arrangement according to claim 1, wherein the auxiliary emitter electrode comprises at least two sub-electrodes.

5. The arrangement according to claim 1, wherein suppressor electrode has an opening of 0.3 to 1.2 mm.

6. The arrangement according to claim 1, wherein the emitter is protruding through the suppressor electrode.

7. The arrangement according to claim 1, wherein the controller is configured to bias the emitter to a negative potential relative to the extractor electrode during the cleaning operation.

8. A wafer imaging system configured for imaging a wafer, comprising:
a gun arrangement configured for generating a primary electron beam for a wafer imaging system, the gun arrangement comprising:
a controller configured for switching between normal operation and cleaning operation;
a field emitter having an emitter tip adapted for providing electrons and emitting an electron beam along an optical axis, wherein the field emitter is selected from the group consisting of: a cold field emitter and a thermally assisted cold field emitter, and wherein the emitter is electrically connected to the controller; and
an extractor electrode adapted for extracting the electron beam from the emitter tip;
a suppressor electrode arranged, with respect to the optical axis, radially outside the emitter, wherein at least one of the suppressor electrode and the extractor electrode is electrically connected to the controller such that the suppressor electrode is at a first potential relative to the extractor electrode during normal operation and at a second, negative potential relative to the extractor electrode during cleaning operation; and
at least one auxiliary emitter electrode arranged, with respect to the optical axis, radially outside the suppressor electrode, and provided as a thermal electron emitter for thermally emitting electrons towards the optical axis; and the wafer imaging system further comprising:
an objective lens configured for focusing the electron beam on the wafer;
at least one condenser lens provided between the emitter tip and the objective lens; and
a scanning deflector arrangement for scanning the electron beam over the specimen to generate the image of the wafer.

9. The system according to claim 8, wherein the objective lens further comprises an electrostatic lens component.

10. The system according to claim 9, wherein the objective lens is a compound magnetic-electrostatic retarding objective lens.

11. The system according to claim 8, further comprising:
a beam separator for spatially separating the electrons emitted from the emitter tip and forming the primary electron beam from electron originating from the wafer and forming the signal electron beam.

12. A method of cleaning at least one surface of an extractor electrode of an electron gun arrangement, the gun arrangement comprising an emitter with an emitter tip, a suppressor electrode, the extractor electrode and an auxiliary emitter electrode, the method comprising:
providing a potential to the suppressor electrode being a negative potential relative to the extractor electrode;
thermally emitting electrons from the auxiliary emitter electrode; and
pre-treating the at least one surface of the extractor electrode surface using the thermally emitted electrons, wherein the potential of the suppressor electrode controls an area of pre-treatment with thermally emitted electrons.

13. The method of claim 12, wherein the negative voltage potential of the suppressor electrode relative to the extractor electrode has an absolute value of 0.5 kV or greater.

14. The method of claim 12, further comprising:
biasing the emitter tip to a negative potential relative to the extractor electrode during thermally emitting electrons.

15. The method of claim 14, wherein the negative potential of the emitter tip relative to the extractor electrode has an absolute value of 0.5 kV or greater.

16. The method of claim 12, wherein the potential of the suppressor forces thermally emitted electrons away from areas outside the surface of the extractor electrode.

17. The method of claim 12, further comprising:
biasing the emitter tip to a potential relative to the suppressor electrode during thermally emitting electrons.

18. The method of claim 17, wherein the potential of the emitter tip relative to the suppressor electrode is in the range of 0 V to −100 V relative to the suppressor electrode.

19. The method of claim 12, further comprising:
switching to a further mode of operation without thermally emitting electrons from an auxiliary emitter electrode, wherein the further mode of operation is a normal operational mode.

20. The system according to claim 8, wherein the controller includes a computer program product including program code being saved thereon for executing a method cleaning at least one surface of the extractor electrode of the electron gun arrangement when the program code is executed, the method comprising:
providing a potential to the suppressor electrode by the controller, the potential being a negative potential relative to the extractor electrode;
thermally emitting electrons from the auxiliary emitter electrode; and
pre-treating the at least one surface of the extractor electrode surface using the thermally emitted electrons, wherein the potential of the suppressor electrode controls an area of pre-treatment with thermally emitted electrons.

\* \* \* \* \*

UNITED STATES PATENT AND TRADEMARK OFFICE
CERTIFICATE OF CORRECTION

PATENT NO.        : 8,957,390 B2                                    Page 1 of 1
APPLICATION NO.   : 14/179283
DATED             : February 17, 2015
INVENTOR(S)       : Pavel Adamec It is certified that error appears in the above-identified patent and that said Letters Patent is hereby corrected as shown below:

In the Specification:

Column 3, Line 46, please delete "copuscles" and insert --corpuscles-- therefor;

Column 4, Line 33, please delete "sham" and insert --sharp-- therefor;

Column 5, Line 4, please delete "subdivided," and insert --subdivided-- therefor;

Column 5, Line 41, please delete "an" and insert --and-- therefor;

Column 6, Line 62, please delete "electrostatic," and insert --electrostatic-- therefor;

Column 8, Line 29, please delete "field," and insert --field-- therefor;

Column 8, Line 40, please delete "field," and insert --field-- therefor;

Column 9, Line 38, please delete "employed," and insert --employed-- therefor;

Column 10, Line 3, please delete "thereof" and insert --thereof,-- therefor;

In the Claims:

Column 12, Line 22, Claim 13, please delete "voltage".

Signed and Sealed this
Twenty-eighth Day of July, 2015

Michelle K. Lee
*Director of the United States Patent and Trademark Office*